(12) United States Patent
Jennings et al.

(10) Patent No.: US 11,496,135 B2
(45) Date of Patent: Nov. 8, 2022

(54) METHOD AND APPARATUS FOR PROVIDING MULTIPLE POWER DOMAINS A PROGRAMMABLE SEMICONDUCTOR DEVICE

(71) Applicant: GOWIN Semiconductor Corporation, GuangZhou (CN)

(72) Inventors: Grant Thomas Jennings, Austin, TX (US); Jinghui Zhu, San Jose, CA (US)

(73) Assignee: GOWIN SEMICONDUCTOR CORPORATION, Guangzhou (CN)

( * ) Notice: Subject to any disclaimer, the term of this patent is extended or adjusted under 35 U.S.C. 154(b) by 2 days.

(21) Appl. No.: 17/325,025

(22) Filed: May 19, 2021

(65) Prior Publication Data

US 2021/0376834 A1 Dec. 2, 2021

Related U.S. Application Data

(60) Provisional application No. 63/033,117, filed on Jun. 1, 2020.

(51) Int. Cl.
| | |
|---|---|
| *H03K 19/177* | (2020.01) |
| *H03K 19/17788* | (2020.01) |
| *H03K 19/1776* | (2020.01) |
| *H03K 19/17704* | (2020.01) |
| *H03K 19/17784* | (2020.01) |

(52) U.S. Cl.
CPC ... *H03K 19/17788* (2013.01); *H03K 19/1776* (2013.01); *H03K 19/17708* (2013.01); *H03K 19/17784* (2013.01)

(58) Field of Classification Search
CPC ....... H03K 19/17708; H03K 19/17788; H03K 19/1776; H03K 19/17784
See application file for complete search history.

(56) References Cited

U.S. PATENT DOCUMENTS

| | | | | |
|---|---|---|---|---|
| 7,142,009 B1 * | 11/2006 | Watt | ...................... | H03K 19/177 326/38 |
| 7,659,746 B2 * | 2/2010 | Chua-Eoan | ........... | G06F 1/3203 326/85 |
| 8,159,263 B1 * | 4/2012 | Tuan | ................... | H03K 19/0016 326/38 |
| 8,327,158 B2 * | 12/2012 | Titiano | ................... | G06F 1/3296 713/300 |
| 9,847,323 B1 * | 12/2017 | Lesea | ...................... | H01L 24/17 |
| 10,574,239 B1 * | 2/2020 | Zhu | ................... | H03K 19/17724 |

(Continued)

*Primary Examiner* — Kurtis R Bahr
(74) *Attorney, Agent, or Firm* — JW Law Group; James M. Wu

(57) ABSTRACT

A semiconductor device, able to be selectively configured to perform one or more user defined logic functions, includes a semiconductor die and a selectable power regulator. The semiconductor die, in one aspect, includes a first region and a second region. The first region is operatable to perform a first set of logic functions based on a first power domain having a first voltage. The second region is configured to perform a second set of logic functions based on a second power domain having a second voltage. The selectable power regulator, in one embodiment, provides the second voltage for facilitating the second power domain in the second region of the semiconductor die in response to at least one enabling input from the first region of the semiconductor die.

14 Claims, 15 Drawing Sheets

(56) References Cited

U.S. PATENT DOCUMENTS

2008/0136397 A1\* 6/2008 Gunther ............... G06F 1/3203
  323/299
2013/0057531 A1\* 3/2013 Lim ..................... G09G 3/3275
  345/211

\* cited by examiner

METHOD AND APPARATUS FOR PROVIDING MULTIPLE POWER DOMAINS A PROGRAMMABLE SEMICONDUCTOR DEVICE

PRIORITY

This application claims the benefit of priority based upon U.S. Provisional Patent Application Ser. No. 63/033,117, filed on Jun. 1, 2020 in the name of the same inventors and entitled "Method and System for Providing Power Control Using Regulator for Multi-die SIPS and Semiconductors with Multiple Power Domains," the disclosure of which is hereby incorporated into the present application by reference.

FIELD

The exemplary embodiment(s) of the present invention relates to the field of computer hardware and software. More specifically, the exemplary embodiment(s) of the present invention relates to power management for a device containing a programmable semiconductor device such as a field-programmable gate array ("FPGA") or programmable logic device ("PLD").

BACKGROUND

With increasing popularity of digital communication, artificial intelligence (AI), IoT (Internet of Things), and/or robotic controls, the demand for faster and efficient hardware and semiconductors with low power consumption is constantly in demand. To meet such demand, high-speed, flexible design, and low-power semiconductor chips are generally more desirable. Hardware industry typically has a variety of approaches to implement to achieve desirable logical functions.

A conventional approach uses dedicated custom integrated circuits and/or application-specific integrated circuits ("ASICs") to implement desirable functions. A shortcoming with ASIC approach is that this approach is generally expensive and limited flexibility. An alternative approach, which enjoys growing popularity, is utilizing programmable semiconductor devices ("PSD") such as programmable logic devices ("PLDs") or field programmable gate arrays ("FPGAs"). For instance, an end user can program a PSD to perform desirable functions.

A conventional PSD such as PLD or FPGA is a semiconductor chip that includes an array of programmable logic array blocks ("LABs") or logic blocks ("LBs"), routing resources, and input/output ("I/O") pins. Each LAB may further include multiple programmable logic elements ("LEs"). For example, each LAB can include 16 LEs to 128 LEs, wherein each LE can be specifically programmed to perform a function or a set of functions.

A drawback associated with a conventional PLD or FPGA is that it is less power efficient.

SUMMARY

A semiconductor device, able to be selectively configured to perform one or more user defined logic functions, includes a semiconductor die and a selectable power regulator. The semiconductor die, in one aspect, includes a first region and a second region. The first region is operable to perform a first set of logic functions based on a first power domain having a first voltage. The second region is configured to perform a second set of logic functions based on a second power domain having a second voltage. The selectable power regulator, in one embodiment, provides the second voltage for facilitating the second power domain in the second region of the semiconductor die in response to at least one enabling input from the first region of the semiconductor die.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1A:
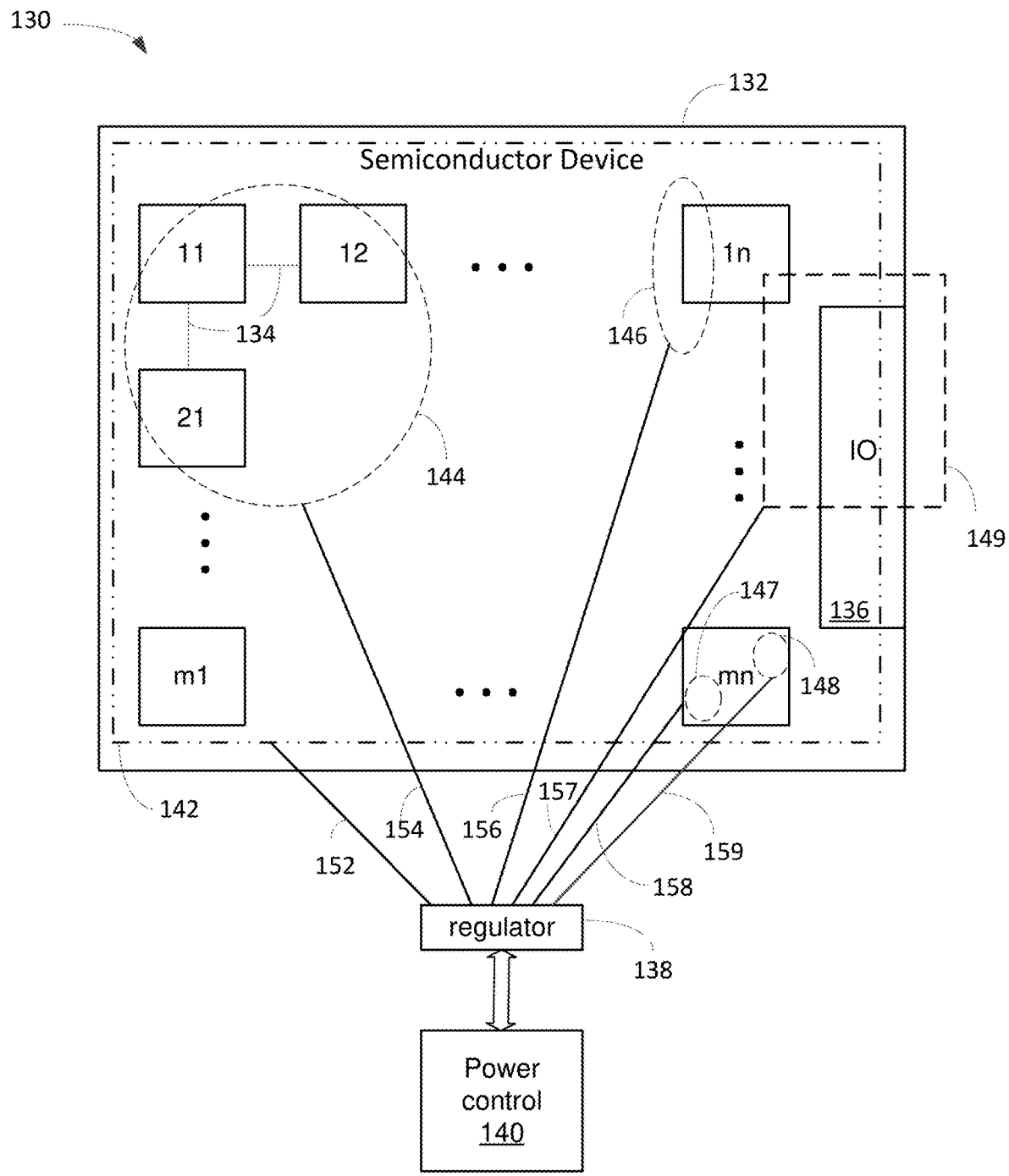
FIGS. 1A-1B are block diagrams illustrating a semiconductor device operable via multiple power domains facilitated by a power regulator in accordance with one embodiment of the present invention.

Embodiments of the present invention disclose a method(s) and/or apparatus for providing a programmable semiconductor device ("PSD"), programmable integrated circuit ("PIC"), or FPGA configured to provide multiple power domains for overall power conservation.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of the present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field-programmable gate arrays (FPGAs), application-specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device, such as but not limited to, magnetoresistive random access memory ("MRAM"), phase-change memory, or ferroelectric RAM ("FeRAM"), flash memory, ROM (Read Only Memory), PROM (Programmable Read-Only Memory), EEPROM (Electrically Erasable Programmable Read-Only Memory), Jump Drive, magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

Embodiments of the present application disclose a device or system that contains a host and a device wherein the device has an FPGA. A semiconductor device, able to be selectively configured to perform one or more user defined logic functions, includes a semiconductor die and a selectable power regulator. The semiconductor die, in one aspect, includes a first region and a second region. The first region is operable to perform a first set of logic functions based on a first power domain having a first voltage. The second region is configured to perform a second set of logic functions based on a second power domain having a second voltage. The selectable power regulator, in one embodiment, provides the second voltage for facilitating the second power domain in the second region of the semiconductor die in response to at least one enabling input from the first region of the semiconductor die.

Power Domains Within a Device

FIG. 1A is a block diagram 130 illustrating a device, a package, a module, or a system containing a semiconductor components and a configurable power regulator ("CPR") in accordance with one embodiment of the present invention. Diagram 130 includes a device or semiconductor device 132, CPR 138, and a power control component 140. Power control component 140, in one example, can be a part of CPR 138 for managing power or voltage outputs. It should be noted that the underlying concept of the exemplary embodiment(s) of the present invention would not change if one or more blocks (circuit or elements) were added to or removed from diagram 130.

Device or semiconductor device 132 includes an m-by-n (m×n) array of circuits or components arranged in m rows and n columns. Circuits or components within the array, such as circuits 11, circuit 12, and circuit 21, are interconnected by links or connections as indicated by numeral 134. Circuits can be semiconductor dies, circuits, or a combination of semiconductor dies and circuits. In one aspect, circuits such as component 11 can be ASICs (application-specific integrated circuits), microprocessors, memories, FPGAs, SoCs (system on a chip), and the like. In one embodiment, device 132 is a semiconductor module or package that houses multiple semiconductor chips and/or dies. Alternatively, device 132 is a die or single integrated circuit ("IC") containing an array of circuits or components capable of providing various logic functions performed under one or more power or voltage domains.

CPR 138 is a voltage regulator or power regulator capable of providing multiple selectable or configurable voltage outputs. CPR 138, in one example, can be a low-dropout ("LDO") regulator. It should be noted that the LDO regulator which is a DC linear voltage regulator regulates output voltage when the supply voltage is close to the output voltage. Alternatively, CPR 138 can also be a DC to DC or DC-DC convertor. A DC-DC converter or regulator employs power switch(es), inductor(s), diode(s) and capacitor(s) to generate the output based on the input power supply.

CPR 138, in one embodiment, is configured to provide multiple voltages to facilitate multiple power or voltage domains. A benefit for using CPR 138 is that it facilitates different circuits or components in the array operate under different power or voltage domains. For example, circuits 11, 12, and 21 are semiconductor components that operates under one power domain or voltage domain 144 facilitated by voltage output 154 of CPR 138. Similarly, a power domain 126 supplies a region of circuit 1n is facilitated by output 156 of CPR 138. In one embodiment, CPR 138 supplies two different power outputs 158-159 to support power domains 147-148 to two regions of circuit or component mn. Also, CPR 138 provides an output 157 to provide power domain 149 for supporting IO component 136 of device 132. It should be noted that CPR 138 can also provide a single power output 152 to provide one single power domain 142 to support device 132.

It should be noted that using one or more regulators with a power enable pin along with a semiconductor device packaged with either multiple die or multiple power domains within the die. CPR 138 can be configured in such a way to provide power management capabilities to various voltage rails within a packaged semiconductor device. The regulator or CPR 138 can be external to the packaged semiconductor device or internal as a multi-die system in package such as device 132.

An advantage of using CPR 138 is that it provides flexibility to facilitate operation of multiple semiconductor dies or circuits operating under different power domains. For example, an FPGA die may have different power requirements than the power requirements of a nonvolatile memory die.

Figure 1B:
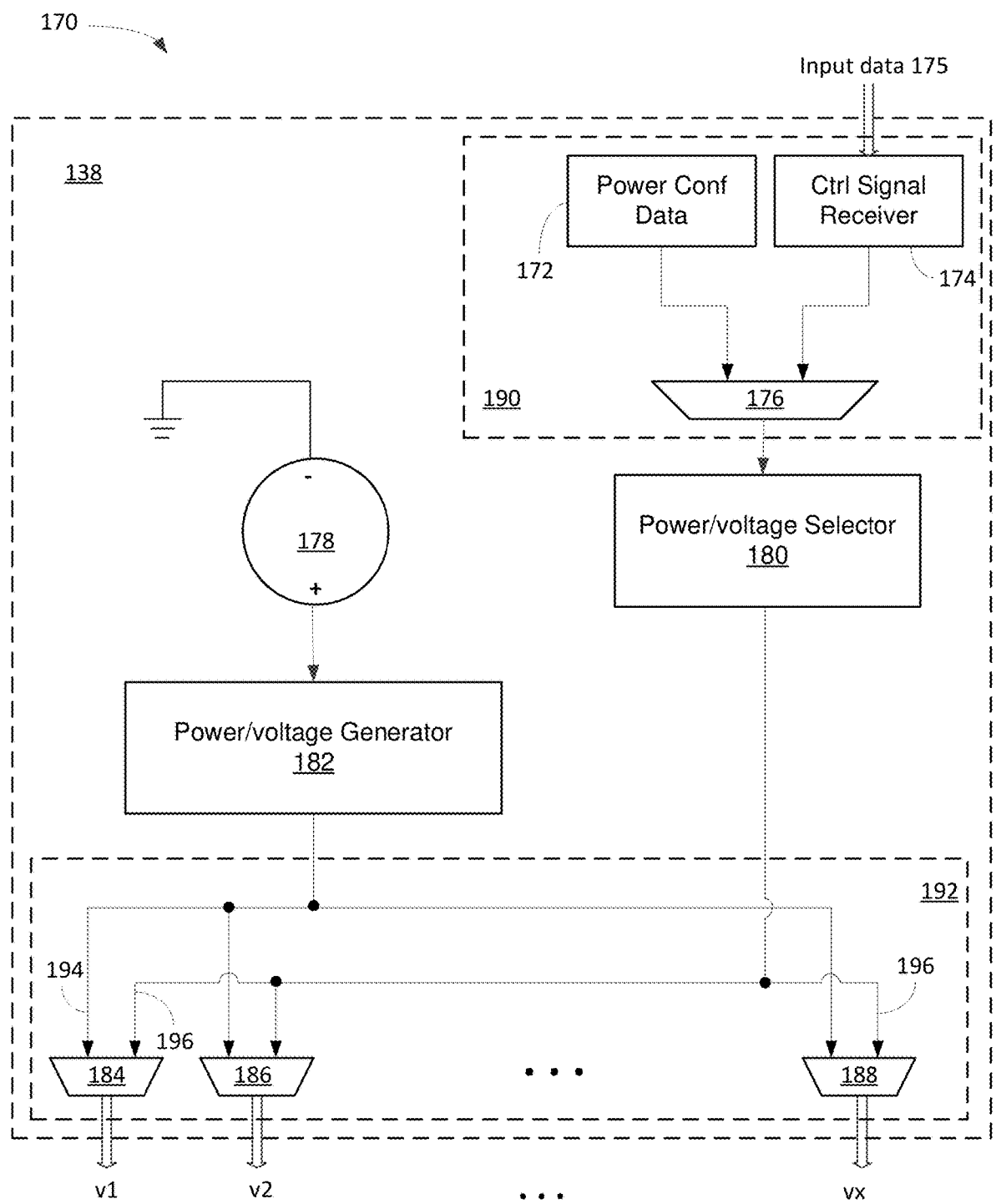

FIG. 1B is a block diagram 170 illustrating a CPR 138 used to provide multiple power outputs for facilitating multiple power domains to a device operating under one or multiple power regions. CPR 138 includes a power source 178, a power input manager 190, a power selector 180, a power generator 182, and selectable output 192. It should be noted that the underlying concept of the exemplary embodiment(s) of the present invention would not change if one or more blocks (circuit or elements) were added to or removed from diagram 170.

Power or voltage generator 182, in one embodiment, is coupled to power source 178 to generate a range of voltage or power outputs. Depending on power source 178, power generator 182 can be configured or programmed to generate a range of voltage levels including, but not limited to, 0.4 volts ("V"), 0.8V, 1.2V, 2.5V, 3.3, 5.0V, and the like. In one aspect, power generator 182 can be programmed to generate a configurable set of voltages based on power configuration data.

Power or voltage selector 180, in one embodiment, is configured to control a group of multiplexers ("muxs") 184-188 to determine which output voltages v1-vx should be gated out or selected. For example, voltage output v1 has an output voltage of 2.5V when power output 194 of power generator 182 is 2.5V and enabling 196 of power selector 180 is active. Alternatively, an output voltage such as voltage vx is in high impedance if enabling 198 is deselected or inactive.

Power input manager 190, in one example, includes a power configuration data 172, a control signal receiver 174, and a selector 176. Control signal receiver 174, in one embodiment, is configured to receive external selecting or enabling input signal(s) to assist which voltage outputs should be selected as output voltage for facilitating a power domain. Power configuration data 172 is a storage or memory configured to store configuration data to select which output voltage(s) should be selected. In one embodiment, selector 176 is configured or programmed to decide whether the configuration data from power configuration data 172 or input data 175 via control signal receiver 174 should be used to select the output voltage(s).

Selectable output 192, in one embodiment includes multiple muxes 184-188. Selectable output 192 receives input from power generator 182 and power selector 180 to decide what range of the power output V1-Vx should be selected.

An advantage of using CPR is to selectively active and/or de-active portions of device based on the activation of power domains.

Figure 2A:
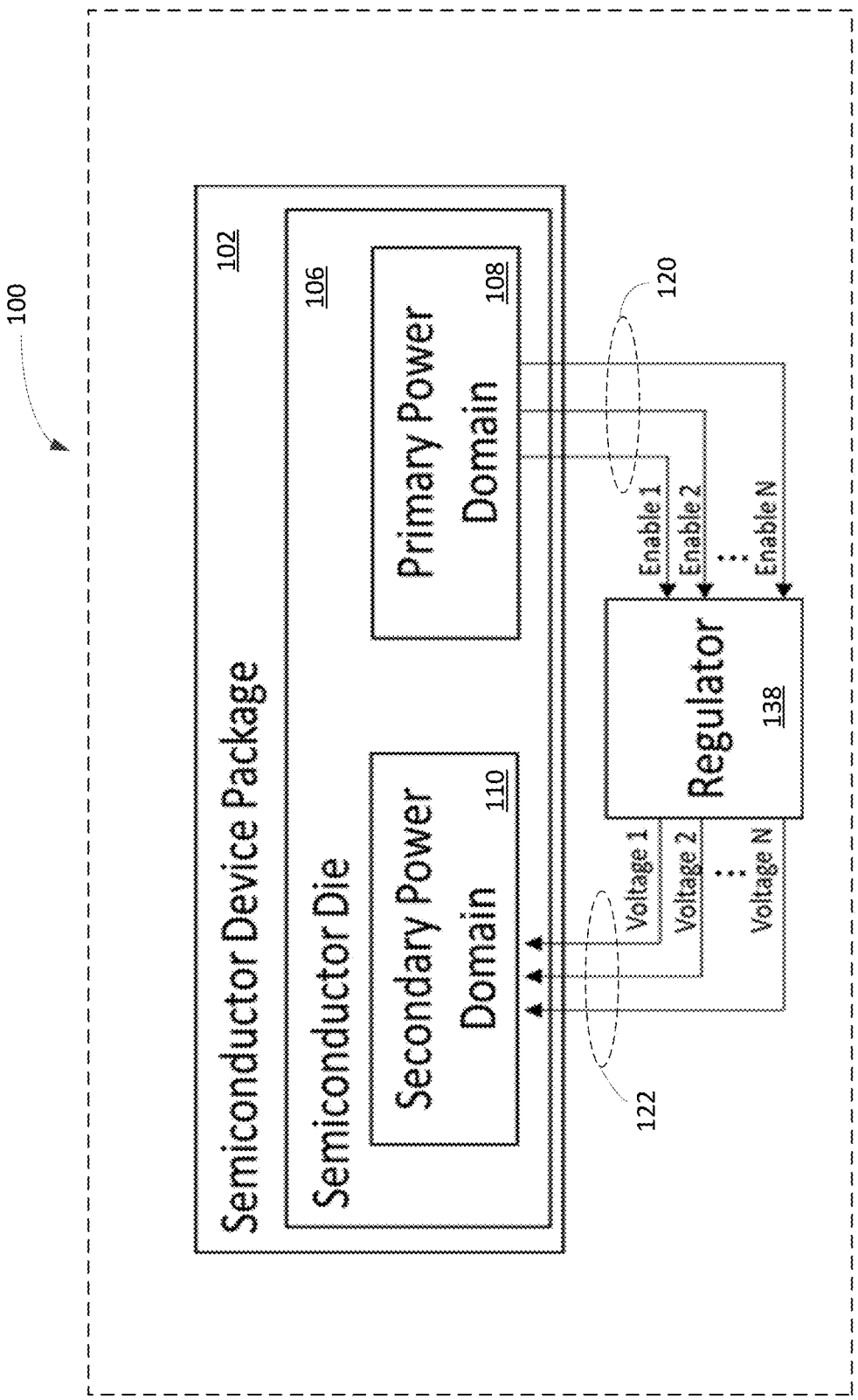
FIGS. 2A-2B are block diagrams illustrating a semiconductor system containing a semiconductor device and a power regulator in accordance with one embodiment of the present invention.

FIG. 2A is a block diagram 100 illustrating a system containing a semiconductor device operating via multiple power domains in accordance with one embodiment of the present invention. Diagram 100 illustrates a system having a semiconductor device package or semiconductor device 102 and a CPR 138 wherein device 102 further includes a semiconductor die 106. In one aspect, semiconductor device 102 includes ASICs, microprocessors, FPGAs, and/or SoCs (system on chips) wherein multiple power domains are used. It should be noted that the underlying concept of the exemplary embodiment(s) of the present invention would not change if one or more blocks (circuit or elements) were added to or removed from diagram 100.

Semiconductor device or device 102 includes a semiconductor die 106 wherein a primary circuitry is operated under a primary power domain 108 and a secondary circuitry is operated under a secondary power domain 110. It should be noted that a semiconductor die can be organized to multiple regions wherein each region of the circuitry or components has an independent power domain. For example, one power domain could in some cases act as the "primary" domain and control power to the "secondary" power domain by controlling the regulator supplying power to it. CPR 138, in one embodiment, is configured to provide voltages 122 to facilitate secondary power domain 110 at the secondary region of the circuitry in response to power enabling signals 120 from the primary region of the circuitry operating under primary power domain 108.

In one embodiment, semiconductor device 102 which is able to be selectively configured to perform one or more user defined logic functions includes semiconductor die 106 and CPR 138. Semiconductor die 106 configured to perform logic functions in accordance with one or more inputs includes a first region and a second region. The first region is a primary region of semiconductor die 106 operatable to perform a first set of logic functions based on a first power domain with a first voltage. The second region which can be the secondary region of semiconductor die 106 is configured to perform a second set of logic functions based on a second power domain having a second voltage. CPR 138 is a selectable power regulator is configured to provide the second voltage for facilitating the second power domain in the second region of the semiconductor die in response to at least one enabling input from the first region of the semiconductor die.

Semiconductor die 106 can be an FPGA, microprocessor, ASIC logic circuitry, IC chip, SOC, and/or SIP. CPR 138, in one embodiment, is able to provide a set of voltages 122 in response to a set of corresponding enabling inputs as indicated by numeral 120. For example, CPR 138 may provide a voltage of 3.3 volts and/or 2.5 volts.

Figure 2B:
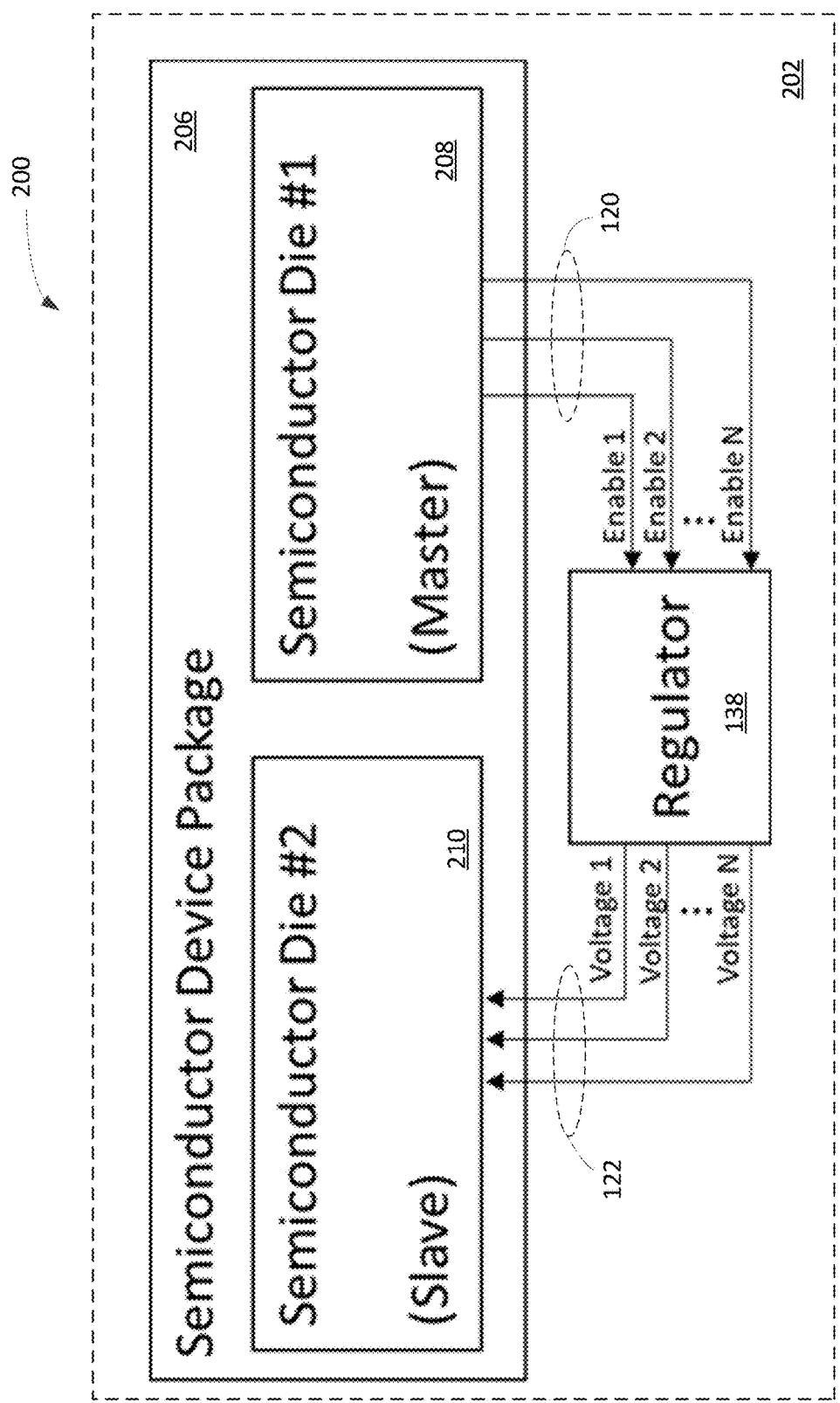

FIG. 2B is a block diagram 200 illustrating a system 202 containing a semiconductor device containing multiple components operating via multiple power domains in accordance with one embodiment of the present invention. Diagram 200, which is similar to diagram 200 shown in FIG. 2A, illustrates semiconductor device package or semiconductor device 206 and CPR 138 except that device 206 includes a master semiconductor die 208 and a slave semiconductor die 210. In one aspect, semiconductor device 206 includes ASICs, microprocessors, FPGAs, and/or SoCs (system on chips) wherein multiple power domains are used. It should be noted that the underlying concept of the exemplary embodiment(s) of the present invention would not change if one or more blocks (circuit or elements) were added to or removed from diagram 200.

In one embodiment, system 202 is a SiPs (System in Package) configured to have independent power domains for each die. For example, one die such as master semiconductor die 208 can behave as a master while another die such as slave semiconductor die 210 behaves as a slave. Master semiconductor die 208, for example, can control the power supply to slave semiconductor die 210 through the enabling signals to the external regulator or PMU (power management unit) such as CPR 138.

Figure 3:
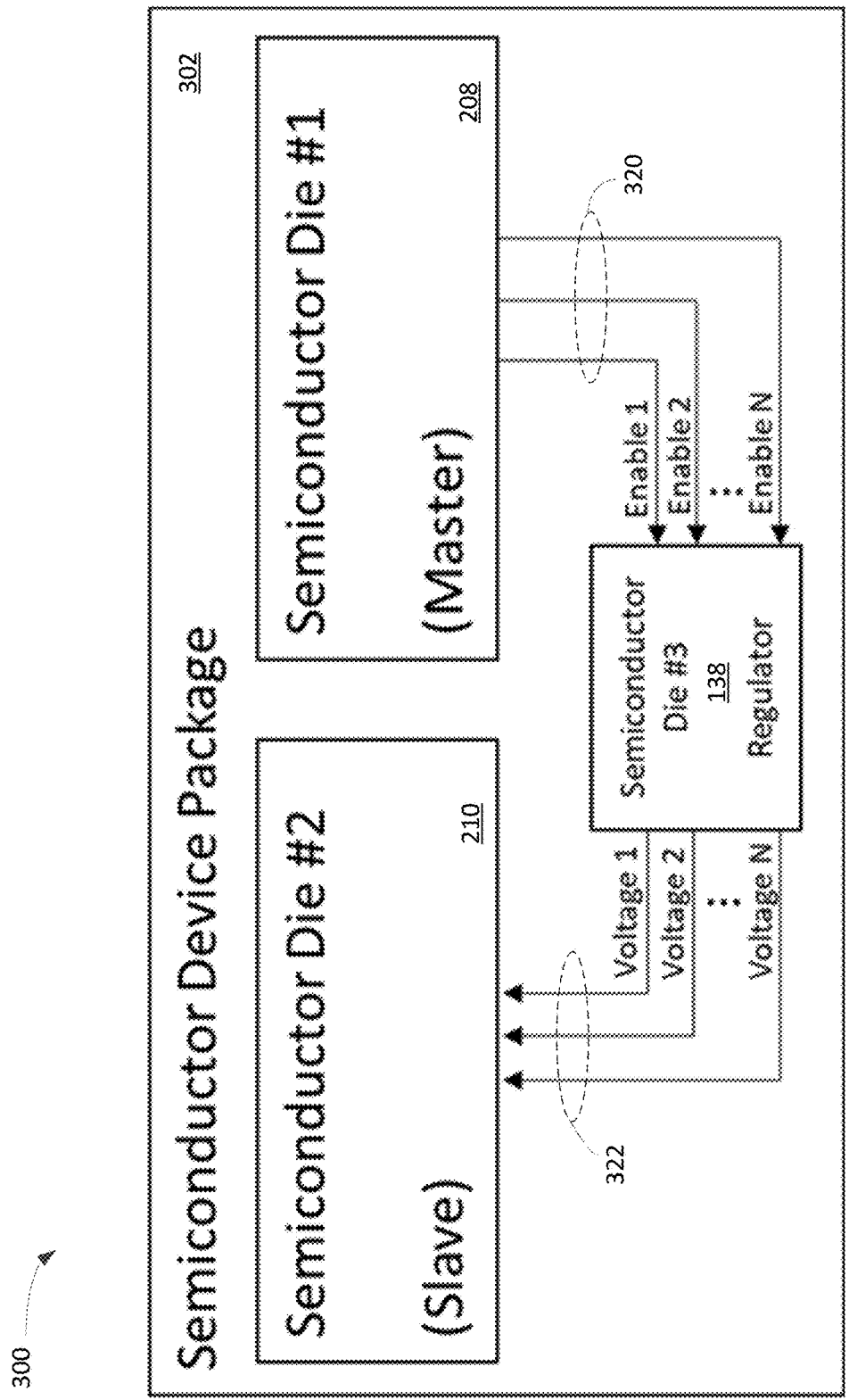
FIG. 3 is a block diagram illustrating a semiconductor device containing semiconductor dies and a power regulator in accordance with one embodiment of the present invention.

FIG. 3 is a block diagram 300 illustrating a system containing a semiconductor device 302 containing multiple components in accordance with one embodiment of the present invention. Diagram 300, which is similar to diagram 200 shown in FIG. 2B, includes semiconductor device package or semiconductor device 302 and CPR 138 except that device 302 includes CPR 138, master semiconductor die 208, and slave semiconductor die 210. In one aspect, semiconductor device 302 can be ASICs, microprocessors, FPGAs, and/or SoCs wherein multiple power domains are used. It should be noted that the underlying concept of the exemplary embodiment(s) of the present invention would not change if one or more blocks (circuit or elements) were added to or removed from diagram 300.

It should be noted that CPR 138 is a regulator controlling power to the slave die such as slave semiconductor die 210 that is integrated into the SiP (System in Package) to provide a single packaged device such as device 302. In an alternative embodiment, device 302 is a single die containing a master circuitry, a slave circuitry, and a CPR circuitry. An advantage of having a single chip or device solution is that integrating a power regulator into a single device can enhance overall power efficiency.

Figure 4:
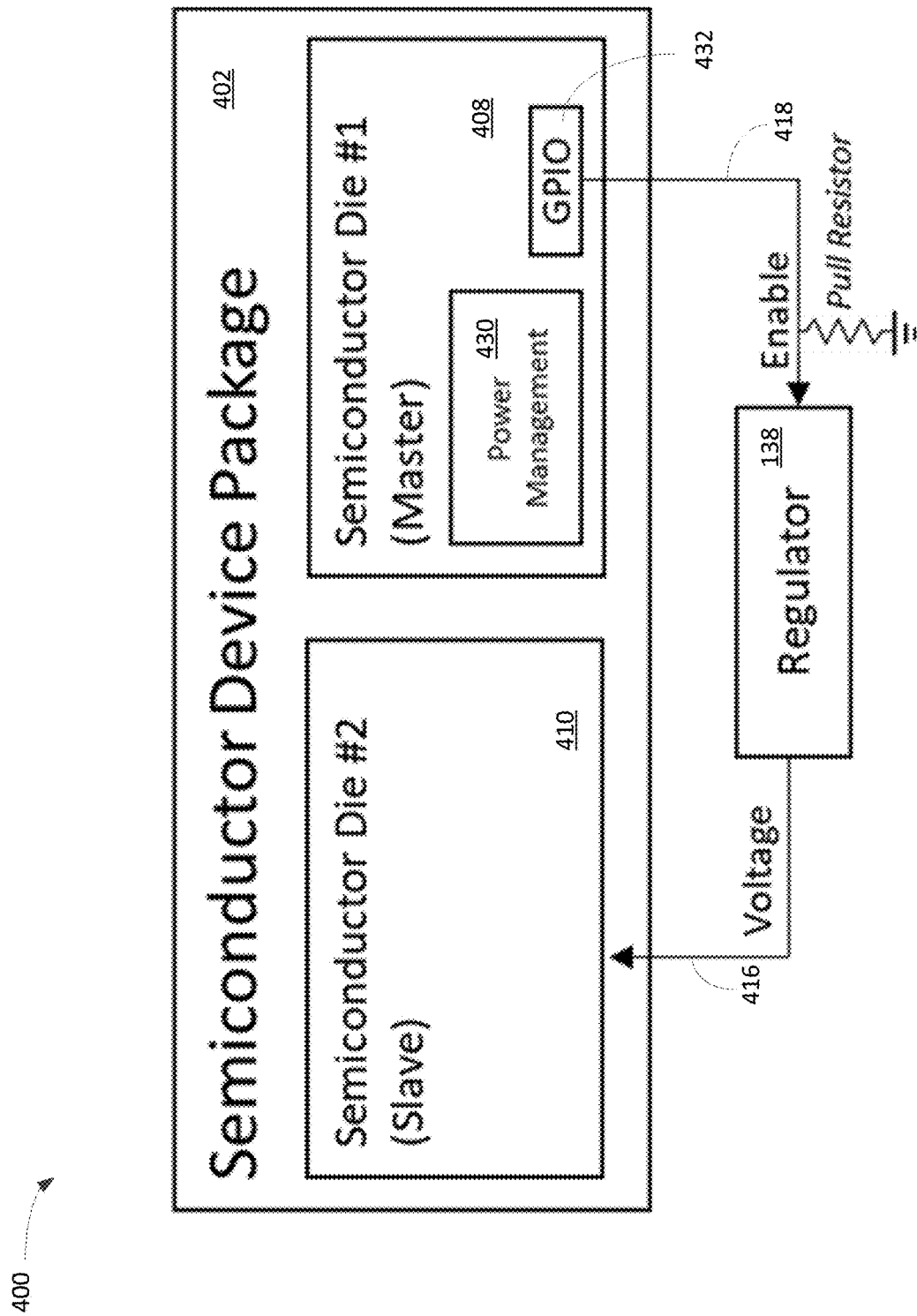
FIG. 4 is a logic diagram illustrating a semiconductor package containing a master semiconductor die and a slave semiconductor in accordance with one embodiment of the present invention.

FIG. 4 is a block diagram 400 illustrating a semiconductor package or device having multiple power domains in accordance with one embodiment of the present invention. Diagram 400, which is similar to diagram 200 shown in FIG. 2B, includes semiconductor device package or semiconductor device 402 and CPR 138 except that master semiconductor die 408 includes a power management 430. Semiconductor device 402, in one example, can be configured to include ASICs, microprocessors, FPGAs, and/or SoCs wherein multiple power domains are used. It should be noted that the underlying concept of the exemplary embodiment(s) of the present invention would not change if one or more blocks (circuit or elements) were added to or removed from diagram 400.

During an operation, master die 408 uses one of its general purpose input output ("GPIO") pin to transmit an enabling signal 428 to a regulator such as CPR 138 to provide additional power modes. Depending on the regulator used, an external pull resistor is needed to create a desired default state. It should be noted that the regulator such as CPR 138 can be integrated within device 402. Depending on the applications, the pull resistor, in one example, facilitates slave die #2 such as die 410 to be in a powered down or powered up state. It should be noted that by leveraging default state from GPIO pins in master die #1, master die #1 can use all of its power states if it has some built in power management unit and control slave die #2 by either driving the GPIOs for the regulator or by leaving the GPIO in a high impedance state and letting the pull resistor control the regulator output accordingly.

Figure 5A:
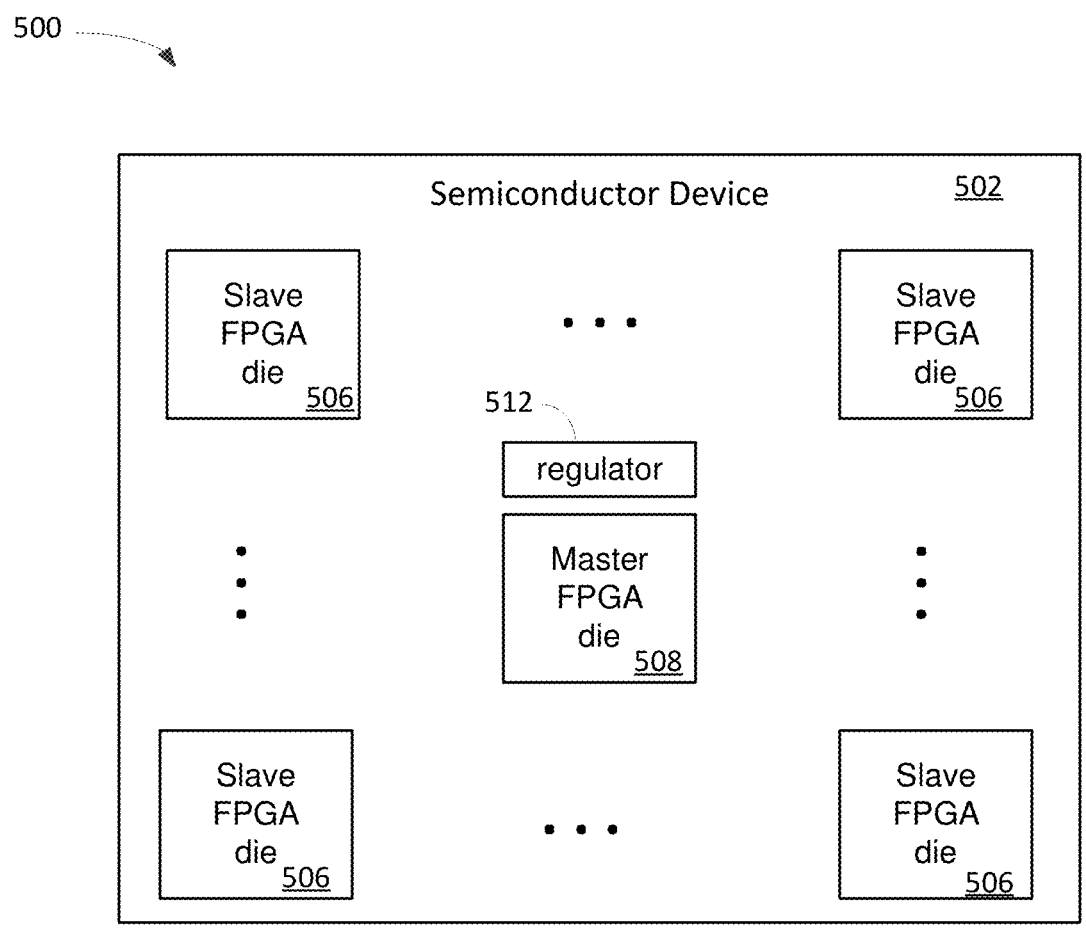
FIGS. 5A-5B are block diagrams illustrating a device containing a regulator for facilitating multiple power domains in accordance with one embodiment of the present invention.

FIG. 5A is a block diagram 500 illustrating a device containing a regulator for facilitating multiple power domains in accordance with one embodiment of the present invention. Diagram 500 illustrates semiconductor device 502 wherein semiconductor device 502 includes at least one master FPGA die 508, multiple slave FPGA dies 506, and CPR 512. In one example, CPR 512 which is similar to CPR 138 is a regulator configured to facilitate multiple power domains. In one embodiment, mater FPGA die 508 is configured to control or manage CPR 512 to provide multiple power domains to one or more slave FPGA dies 506. It should be noted that the underlying concept of the exemplary embodiment(s) of the present invention would not change if one or more blocks (circuit or elements) were added to or removed from diagram 500.

A semiconductor device 502, in one embodiment, is able to house multiple dies 506-508 wherein at least one die is configurable to perform one or more user defined logic functions. Device 502 includes master FPGA die 508, multiple slave FPGA dies 506, and a selectable power regulator or CPR 512. Master FPGA die, in one aspect, is configured to be programmable to generate enabling signals for managing power distribution in accordance with configuration data. Slave FPGA dies 506 provides logic functions in response to corresponding power domain(s) and/or configuration data. Selectable power regulator or CPR 512 is configured to facilitate providing multiple power domains to slave FPGA dies 506 in accordance with the enabling signals (not shown in FIG. 5A) from master FPGA die 508.

Figure 5B:
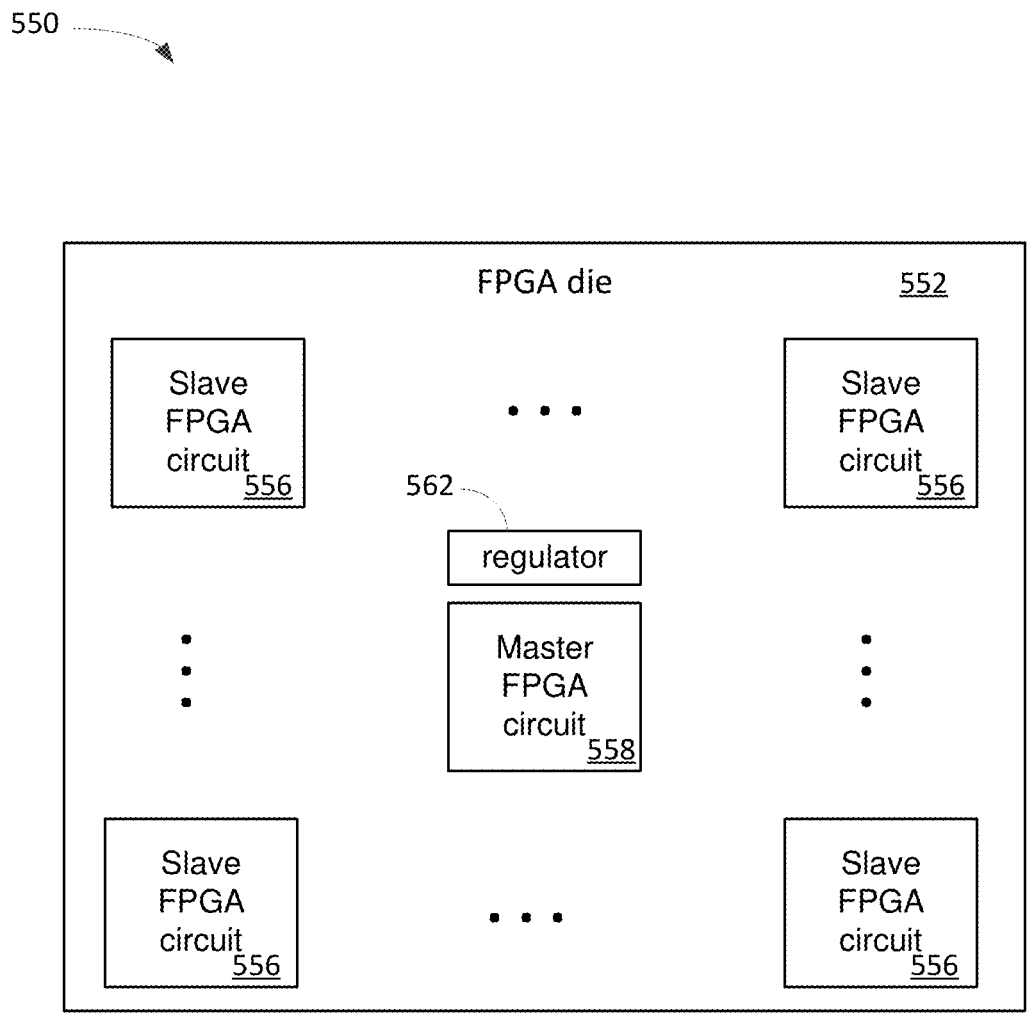

FIG. 5B is a block diagram 550 illustrating a device containing a regulator for facilitating multiple power domains in accordance with one embodiment of the present invention. Diagram 550 which is similar to diagram 500 shown in FIG. 5A except that diagram 550 includes an FPGA die 552 containing at least one master FPGA circuit 558, multiple slave FPGA circuit 566, and CPR circuit 562. In one example, CPR circuit 562, which is similar to CPR 138, performs a function of a regulator for facilitating multiple power domains. In one embodiment, mater FPGA circuit 558 is configured to control or manage CPR circuit 562 to provide multiple power domains to one or more slave FPGA circuits 556. It should be noted that the underlying concept of the exemplary embodiment(s) of the present invention would not change if one or more blocks (circuit or elements) were added to or removed from diagram 550.

Figure 6:
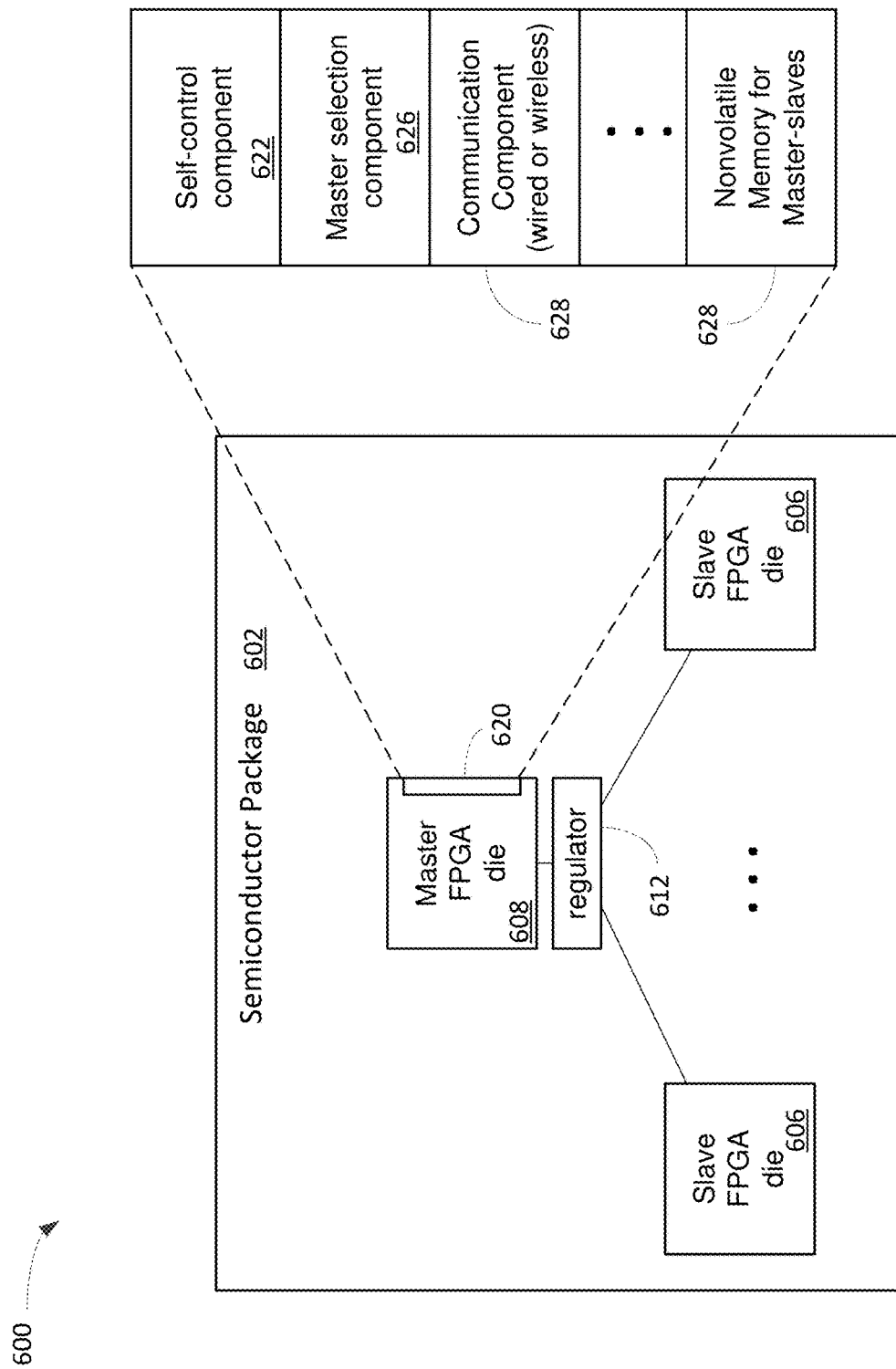
FIG. 6 is a block diagram illustrating a semiconductor package containing master(s) and slaves operating under multiple power domains in accordance with one embodiment of the present invention.

FIG. 6 is a block diagram 600 illustrating a semiconductor package 602 containing master(s) and slaves operating under multiple power domains in accordance with one embodiment of the present invention. Package 602 includes a master FPGA die 608, multiple slave FPGA dies 606, and a CPR 612 wherein CPR 612 is a regulator operating similar to CPR 138 shown in FIG. 1B. It should be noted that the underlying concept of the exemplary embodiment(s) of the present invention would not change if one or more blocks (circuit or elements) were added to or removed from diagram 600.

Master FPGA die 608, in one embodiment, contains a power management 620 for facilitating multiple power domains to slave FPGA dies 606. Power management 620 includes a self-control component 622, master selection component 626, communication component 628, and nonvolatile memory 628. Self-control component, in one aspect, is configured to allow master FPGA die to enter a power saving mode based on the configuration data. Master selection component 626 is configured to elect a new master die from slave FPGA dies 606 based on a set of predefined election process. Communication component 628 provides communication with an external device via a wired or wireless communication network. Nonvolatile memory 628 is configured to selectively grant a request of memory access to one of slave FPGA dies 606.

Programmable Semiconductor Device (PSD)

Figure 7A:
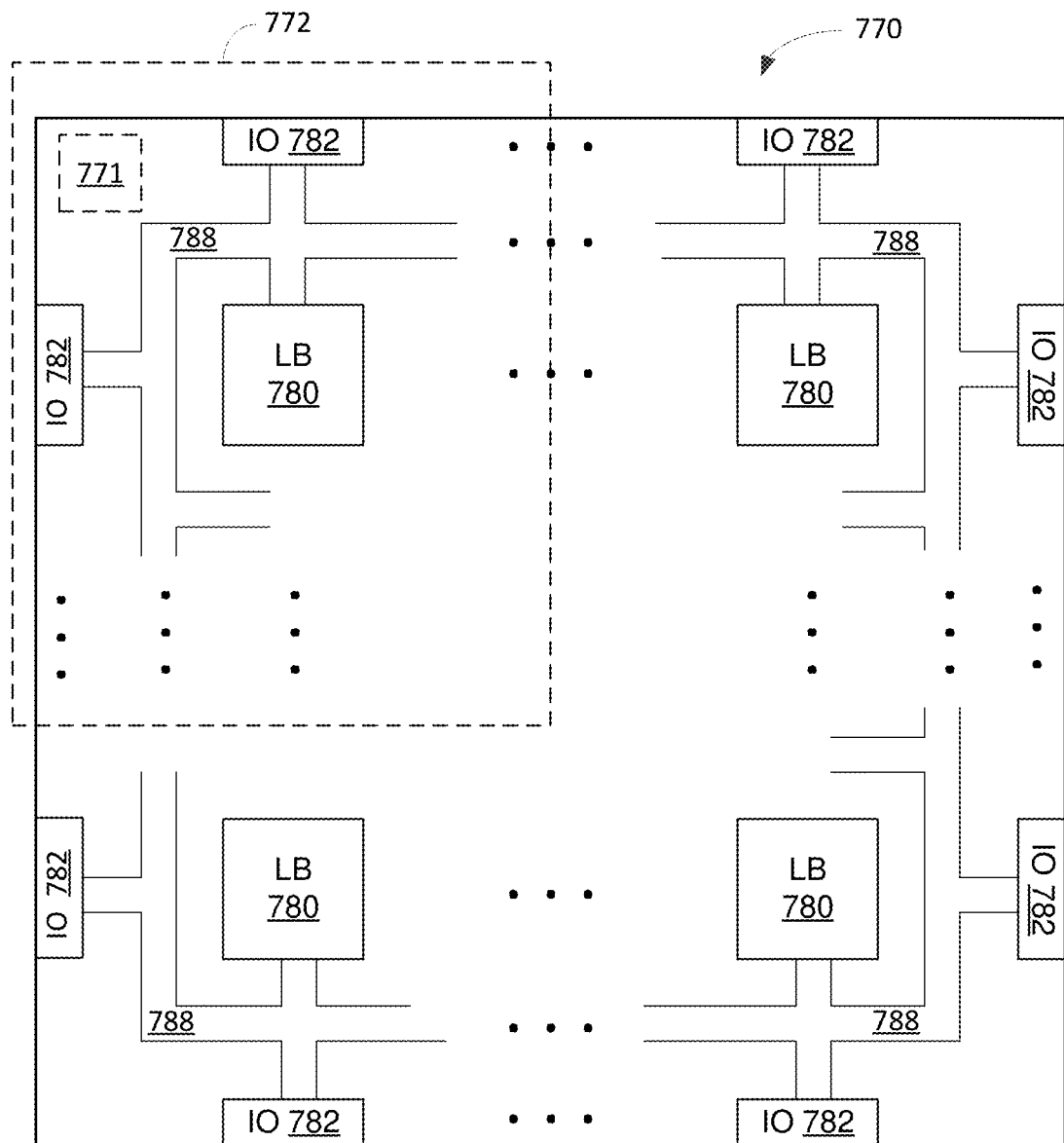
FIGS. 7A-7C are block diagrams illustrating a programmable semiconductor device ("PSD") or FPGA able to facilitate multiple power domains for power conservation in accordance with one embodiment of the present invention.

FIG. 7A is a block diagram 770 illustrating a programmable semiconductor device ("PSD") or FPGA able to facilitate multiple power domains in accordance with one embodiment of the present invention. PSD, also known as FPGA, PIC, and/or a type of Programmable Logic Device ("PLD"), includes an UII and/or a SDB capable of facilitating USB 2.0 data transmission. A function of UII and/or SDB is to use a portion of PSD existing logic blocks such as block 720 to facilitate multiple power domains so that it enhances overall versatilities as well as the efficiency of PSD. It should be noted that the underlying concept of the exemplary embodiment(s) of the present invention would not change if one or more blocks (circuit or elements) were added to or removed from diagram 770.

PSD includes an array of configurable LBs 780 surrounded by input/output blocks ("IOs") 782, and programmable interconnect resources 788 ("PIR") that include vertical interconnections and horizontal interconnections extending between the rows and columns of logic block ("LB") 780 and IO 782. PRI 788 may further include interconnecting array decoders ("IAD") or programmable interconnection array ("PIA"). It should be noted that the terms PRI, IAD, and PIA may be used interchangeably hereinafter.

Each LB, in one example, includes programmable combinational circuitry and selectable output registers programmed to implement at least a portion of a user's logic function. The programmable interconnections, connections, or channels of interconnect resources are configured using various switches to generate signal paths between the LBs 780 for performing logic functions. Each IO 782 is programmable to selectively use an IO pin (not shown) of PSD.

PIC, in one embodiment, can be divided into multiple programmable partitioned regions ("PPRs") 772 wherein each PPR 772 includes a portion of LBs 780, some PPRs 788, and IOs 782. A benefit of organizing PIC into multiple PPRs 772 is to optimize management of storage capacity, power supply, and/or network transmission.

Bitstream is a binary sequence (or a file) containing programming information or data for a PIC, FPGA, or PLD. The bitstream is created to reflect the user's logic functions together with certain controlling information. For an FPGA or PLD to function properly, at least a portion of the registers or flipflops in FPGA needs to be programmed or configured before it can function. It should be noted that bitstream is used as input configuration data to FPGA.

A benefit of using multiple power domains is to enhance overall FPGA efficiency.

Figure 7B:
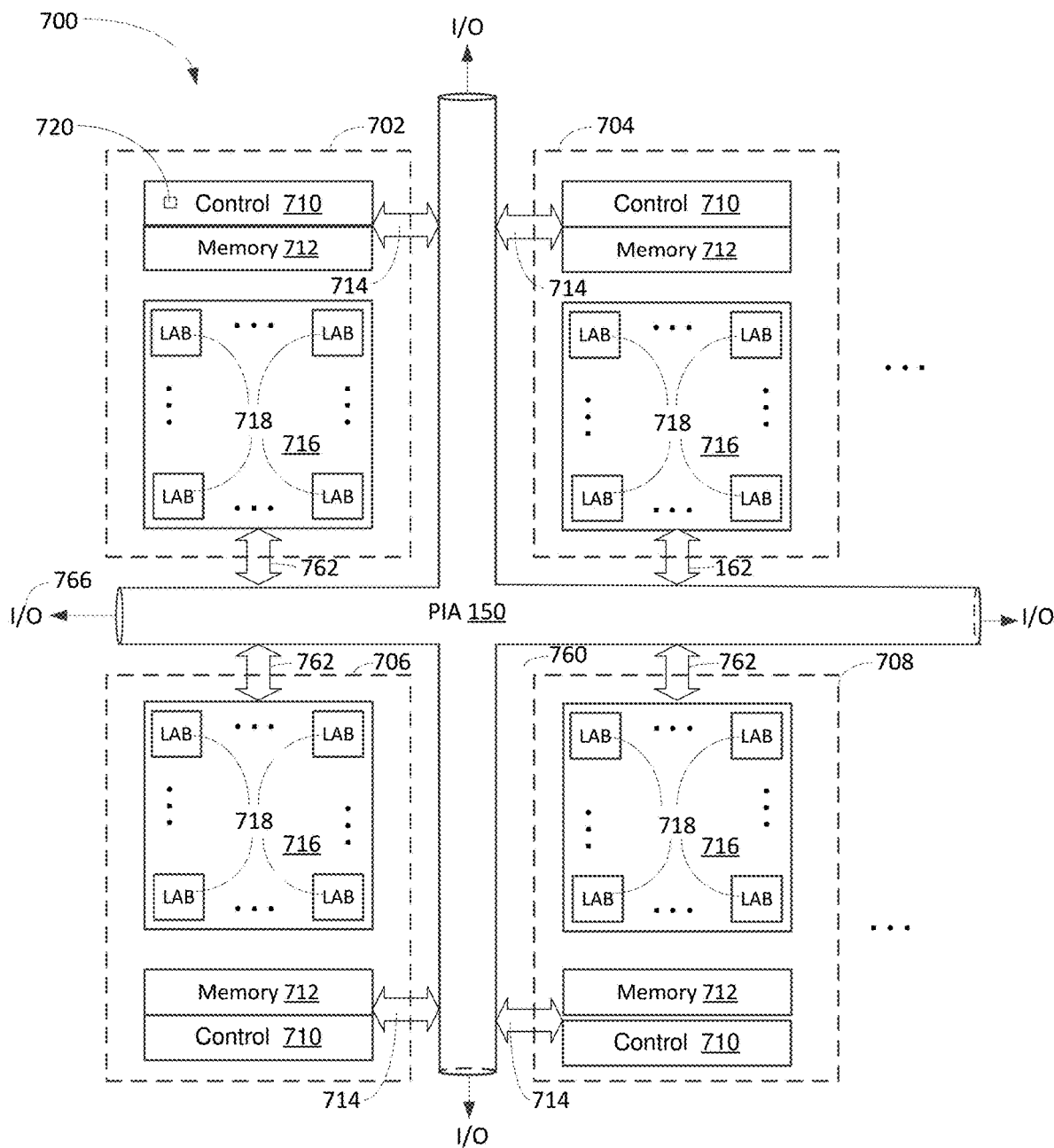

FIG. 7B is block diagrams illustrating a PSD operable to carry out various user-defined logic operations using multiple power domains in accordance with one embodiment of the present invention. To simplify the foregoing discussion, the terms "PSD", "PIC", FPGA, and PLD are referring the same or similar devices and they can be used interchangeably hereinafter. Diagram 700 includes multiple PPRs 702-708, PIA 750, and regional IO ports 766. PPRs 702-708 further includes control units 710, memory 712, and LBs 716. Note that control units 710 can be configured into one single control unit, and similarly, memory 712 can also be configured into one single memory for storing configurations. It should be noted that the underlying concept of the exemplary embodiment(s) of the present invention would not change if one or more blocks (circuit or elements) were added to or removed from diagram 700.

LBs 716, also known as configurable function unit ("CFU") include multiple logic array blocks ("LABs") 718 which is also known as a configurable logic unit ("CLU"). Each LAB 716, for example, can be further organized to include, among other circuits, a set of programmable logical elements ("LEs"), configurable logic slices ("CLS"), or macrocells, not shown in FIG. 7B. Each LAB, in one example, may include anywhere from 32 to 512 programmable LEs. IO pins (not shown in FIG. 7B), LABs, and LEs are linked by PIA 750 and/or other buses, such as buses 762 or 714, for facilitating communication between PIA 750 and PPRs 702-708.

Each LE includes programmable circuits such as the product-term matrix, lookup tables, and/or registers. LE is also known as a cell, configurable logic block ("CLB"), slice, CFU, macrocell, and the like. Each LE can be independently configured to perform sequential and/or combinatorial logic operation(s). It should be noted that the underlying concept of PSD would not change if one or more blocks and/or circuits were added or removed from PSD.

Control units 710, also known as configuration logics, can be a single control unit. Control unit 710, for instance, manages and/or configures individual LE in LAB 718 based on the configuring information stored in memory 712. It should be noted that some IO ports or IO pins are configurable so that they can be configured as input pins and/or output pins. Some IO pins are programmed as bi-directional IO pins while other IO pins are programmed as unidirectional IO pins. The control units such as unit 710 are used to handle and/or manage PSD operations in accordance with system clock signals.

LBs 716 include multiple LABs that can be programmed by the end-user(s). Each LAB contains multiple LEs wherein each LE further includes one or more lookup tables ("LUTs") as well as one or more registers (or D flip-flops or latches). Depending on the applications, LEs can be configured to perform user-specific functions based on a predefined functional library facilitated by the configuration software. PSD, in some applications, also includes a set fixed circuit for performing specific functions. For example, the fixed circuits include, but not limited to, a processor(s), a DSP (digital signal processing) unit(s), a wireless transceiver(s), and so forth.

PIA 750 is coupled to LBs 716 via various internal buses such as buses 714 or 762. In some embodiments, buses 714 or 762 are part of PIA 750. Each bus includes channels or wires for transmitting signals. It should be noted that the terms channel, routing channel, wire, bus, connection, and interconnection are referred to as the same or similar connections and will be used interchangeably herein. PIA 750 can also be used to receive and/or transmits data directly or indirectly from/to other devices via IO pins and LABs.

Memory 712 may include multiple storage units situated across a PPR. Alternatively, memories 712 can be combined into one single memory unit in PSD. In one embodiment, memory 712 is an NVM storage unit used for both configuration and user memory. The NVM storage unit can be, but not limited to, MRAM, flash, Ferroelectric RAM, and/or phase changing memory (or chalcogenide RAM). Depending on the applications, a portion of the memory 712 can be designated, allocated, or configured to be a block RAM ("BRAM") used for storing large amounts of data in PSD.

A PSD includes many programmable or configurable LBs 716 that are interconnected by PIA 750, wherein each programmable LB is further divided into multiple LAB s 718. Each LAB 718 further includes many LUTs, multiplexers and/or registers. During configuration, a user programs a truth table for each LUT to implement a desired logical function. It should be noted that each LAB, which can be further organized to include multiple logic elements ("LEs"), can be considered as a configurable logic cell ("CLC") or slice. For example, a four-input (16 bit) LUT receives LUT inputs from a routing structure (not shown in FIG. 7B). Based upon the truth table programmed into LUT during configuration of PSD, a combinatorial output is generated via a programmed truth table of LUT in accordance with the logic values of LUT inputs. The combinatorial output is subsequently latched or buffered in a register or flip-flop before the clock cycle ends.

Figure 7C:
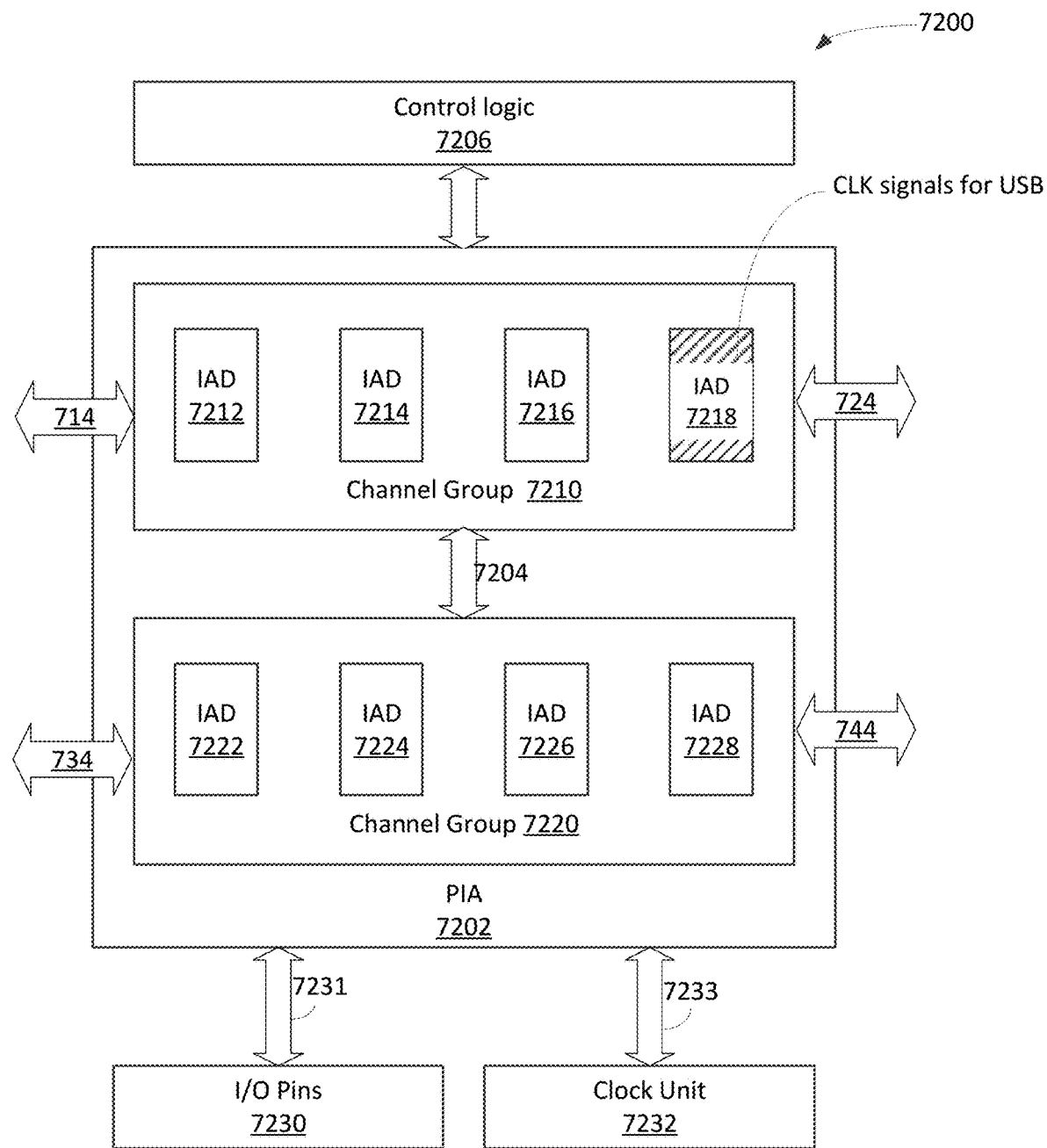

FIG. 7C is a block diagram 7200 illustrating a routing logic or routing fabric containing programmable interconnection arrays capable of routing data and/or clock signals in accordance with one embodiment of the present invention. Diagram 7200 includes control logic 7206, PIA 7202, IO pins 7230, and clock unit 7232. Control logic 7206, which may be similar to control units shown in FIG. 7C, provides various control functions including channel assignment, differential IO standards, and clock management. Control logic 7206 may contain volatile memory, non-volatile memory, and/or a combination of the volatile and nonvolatile memory device for storing information such as configuration data. In one embodiment, control logic 7206 is incorporated into PIA 7202. It should be noted that the underlying concept of the exemplary embodiment(s) of the present invention would not change if one or more blocks (circuit or elements) were added to or removed from diagram 7200.

IO pins 7230, connected to PIA 7202 via a bus 7231, contain many programmable IO pins configured to receive and/or transmit signals to external devices. Each programmable IO pin, for instance, can be configured to input, output, and/or bi-directional pin. Depending on the applications, IO pins 7230 may be incorporated into control logic 7206.

Clock unit 7232, in one example, connected to PIA 7202 via a bus 7233, receives various clock signals from other components, such as a clock tree circuit or a global clock oscillator. Clock unit 7232, in one instance, generates clock signals in response to system clocks as well as reference clocks for implementing IO communications. Depending on the applications, clock unit 7232, for example, provides clock signals to PIA 7202 including reference clock(s).

PIA 7202, in one aspect, is organized into an array scheme including channel groups 7210 and 7220, bus 7204, and IO buses 714, 724, 734, 744. Channel groups 7210, 7220 are used to facilitate routing information between LBs based on PIA configurations. Channel groups can also communicate with each other via internal buses or connections such as bus 7204. Channel group 7210 further includes interconnecting array decoders ("IADs") 7212-7218. Channel group 7220 includes four IADs 7222-7228. A function of IAD is to provide configurable routing resources for data transmission.

IAD such as IAD 7212 includes routing multiplexers or selectors for routing signals between IO pins, feedback outputs, and/or LAB inputs to reach their destinations. For example, an IAD can include up to 36 multiplexers which can be laid out in four banks wherein each bank contains nine rows of multiplexers. It should be noted that the number of IADs within each channel group is a function of the number of LEs within the LAB.

PIA 7202, in one embodiment, designates a special IAD such as IAD 7218 for facilitating multiple power domains.

For example, IAD 7218 handles or distributes connections and/or routings multiple power domains.

Systems and Network Systems

Figure 8:
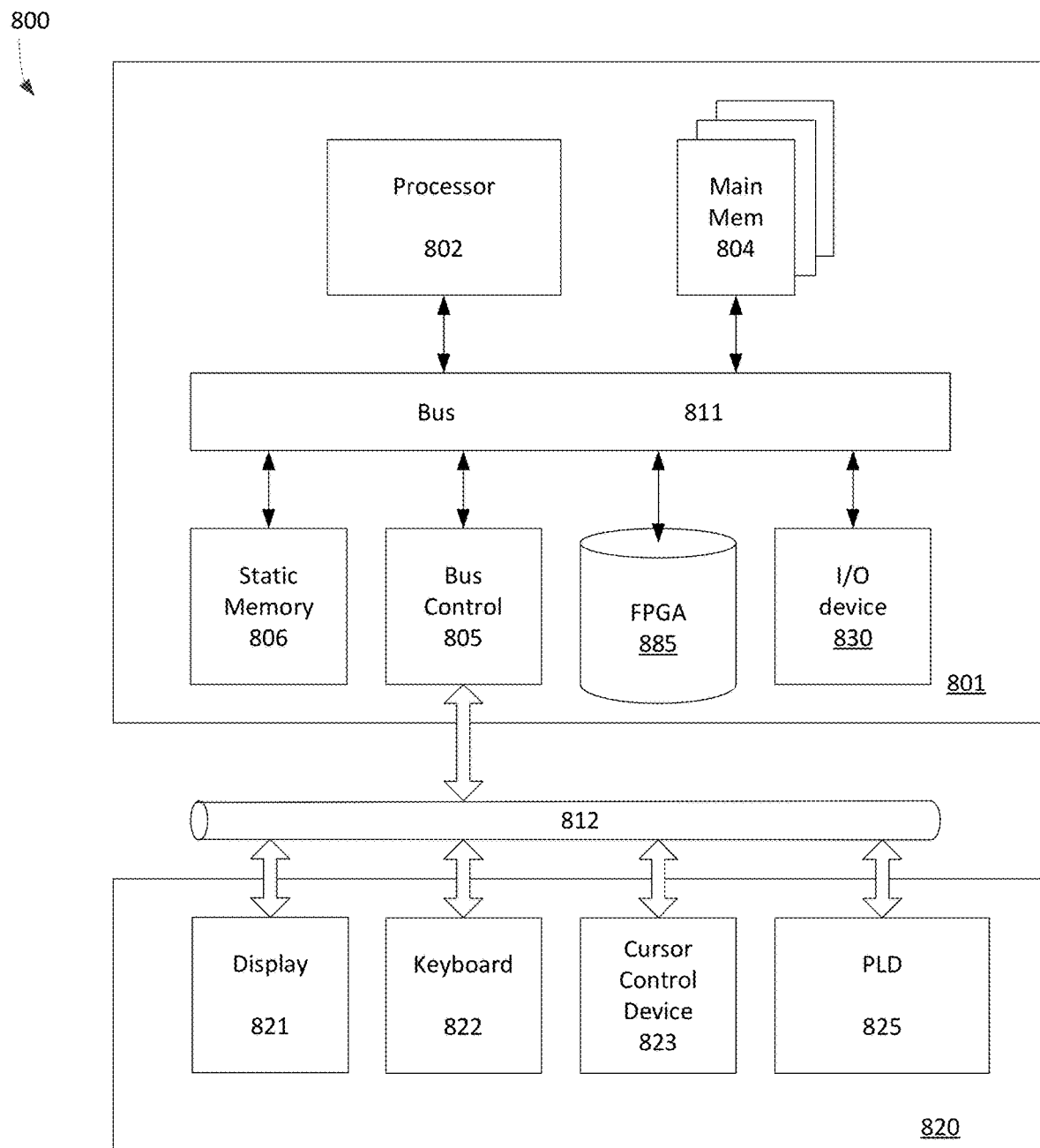
FIG. 8 is a diagram illustrating a system or computer using PSD with multiple power domains to enhance programmability of PSD in accordance with one embodiment of the present invention.

FIG. 8 is a diagram illustrating a system or computer using PSD with multiple power domains to enhance programmability of PSD in accordance with one embodiment of the present invention. Computer system 800 includes a processing unit 801, an interface bus 812, and an input/output ("IO") unit 820. Processing unit 801 includes a processor 802, main memory 804, system bus 811, static memory device 806, bus control unit 805, IO element 830, and FPGA 885. It should be noted that the underlying concept of the exemplary embodiment(s) of the present invention would not change if one or more blocks (circuit or elements) were added to or removed from FIG. 8.

Bus 811 is used to transmit information between various components and processor 802 for data processing. Processor 802 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 804, which may include multiple levels of cache memories, stores frequently used data and instructions. Main memory 804 may be RAM (random access memory), MRAM (magnetic RAM), or flash memory. Static memory 806 may be a ROM (read-only memory), which is coupled to bus 811, for storing static information and/or instructions. Bus control unit 805 is coupled to buses 811-812 and controls which component, such as main memory 804 or processor 802, can use the bus. Bus control unit 805 manages the communications between bus 811 and bus 812. Mass storage memory or SSD which may be a magnetic disk, an optical disk, hard disk drive, floppy disk, CD-ROM, and/or flash memories are used for storing large amounts of data.

IO unit 820, in one embodiment, includes a display 821, keyboard 822, cursor control device 823, and low-power PLD 825. Display device 821 may be a liquid crystal device, cathode ray tube ("CRT"), touch-screen display, or other suitable display devices. Display 821 projects or displays images of a graphical planning board. Keyboard 822 may be a conventional alphanumeric input device for communicating information between computer system 800 and computer operator(s). Another type of user input device is cursor control device 823, such as a conventional mouse, touch mouse, trackball, or other types of the cursor for communicating information between system 800 and user(s).

PLD 825 is coupled to bus 812 for providing configurable logic functions to local as well as remote computers or servers through a wide-area network. PLD 825 and/or FPGA 885 are configured to facilitate the operation of UII and/or SDB to improve overall efficiency of FPGA and/or PLD. In one example, PLD 825 may be used in a modem or a network interface device for facilitating communication between computer 800 and the network. Computer system 800 may be coupled to servers via a network infrastructure as illustrated in the following discussion.

Figure 9:
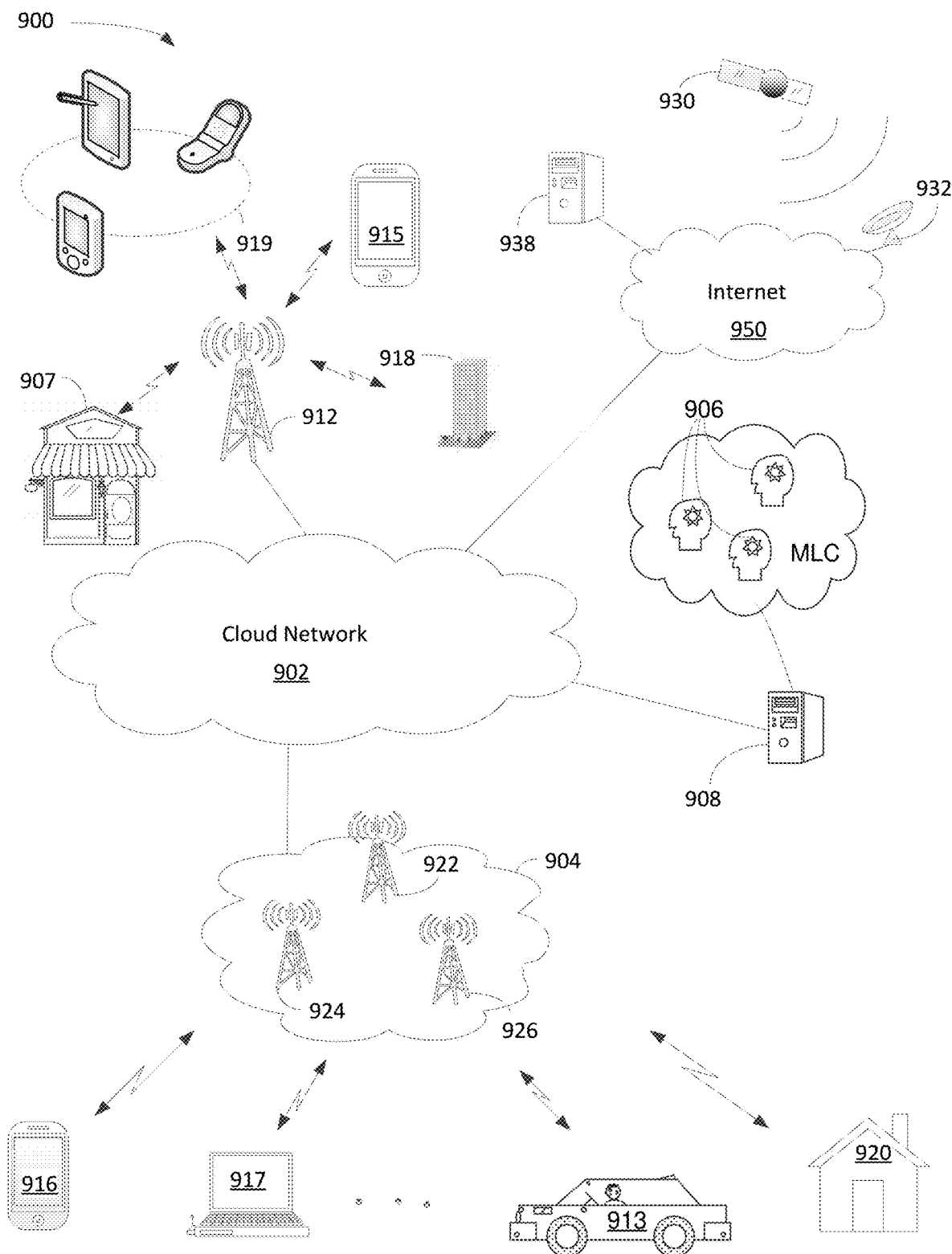
FIG. 9 is a block diagram illustrating various applications of PSD (e.g., FPGA, PLD, etc.) capable of facilitating user-defined logic functions using multiple power domains in accordance with one embodiment of the present invention.

FIG. 9 is a block diagram illustrating various applications of PSD (e.g., FPGA, PLD, etc.) capable of facilitating user-defined logic functions using multiple power domains in accordance with one embodiment of the present invention. Diagram 900 illustrates AI server 908, communication network 902, switching network 904, Internet 950, and portable electric devices 913-919. In one aspect, PSD capable of facilitating multiple power domains is used in an AI server, portable electric devices, and/or switching network. Network or cloud network 902 can be a wide area network, metropolitan area network ("MAN"), local area network ("LAN"), satellite/terrestrial network, or a combination of a wide-area network, MAN, and LAN. It should be noted that the underlying concept of the exemplary embodiment(s) of the present invention would not change if one or more blocks (or networks) were added to or removed from diagram 900.

Network 902 includes multiple network nodes, not shown in FIG. 9, wherein each node may include mobility management entity ("MME"), radio network controller ("RNC"), serving gateway ("S-GW"), packet data network gateway ("P-GW"), or Home Agent to provide various network functions. Network 902 is coupled to Internet 950, AI server 908, base station 912, and switching network 904. Server 908, in one embodiment, includes machine learning computers ("MLC") 906.

Switching network 904, which can be referred to as packet core network, includes cell sites 922-926 capable of providing radio access communication, such as 3G ($3^{rd}$ generation), 4G, or 5G cellular networks. Switching network 904, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 904 is logically coupling multiple users and/or mobiles 916-920 across a geographic area via cellular and/or wireless networks. It should be noted that the geographic area may refer to campus, city, metropolitan area, country, continent, or the like.

Base station 912, also known as cell-site, node B, or eNodeB, includes a radio tower capable of coupling to various user equipments ("UEs") and/or electrical user equipments ("EUEs"). The term UEs and EUEs are referring to similar portable devices and they can be used interchangeably. For example, UEs or PEDs can be cellular phone 915, laptop computer 917, iPhone® 916, tablets, and/or iPad® 919 via wireless communications. A handheld device can also be a smartphone, such as iPhone®, BlackBerry®, Android®, and so on. Base station 912, in one example, facilitates network communication between mobile devices such as portable handheld device 913-919 via wired and wireless communications networks. It should be noted that base station 912 may include additional radio towers as well as other land switching circuitry.

Internet 950 is a computing network using Transmission Control Protocol/Internet Protocol ("TCP/IP") to provide linkage between geographically separated devices for communication. Internet 950, in one example, couples to supplier server 938 and satellite network 930 via satellite receiver 932. Satellite network 930, in one example, can provide many functions as wireless communication as well as a global positioning system ("GPS"). It should be noted that the UII and/or SDB operation enhancing efficiency of FPGA can benefit many applications, such as but not limited to, smartphones 913-919, satellite network 930, automobiles 913, AI servers 908, business 907, and homes 920.

The exemplary embodiment of the present invention includes various processing steps, which will be described below. The steps of the embodiment may be embodied in machine or computer-executable instructions. The instructions can be used to cause a general-purpose or special-purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 10:
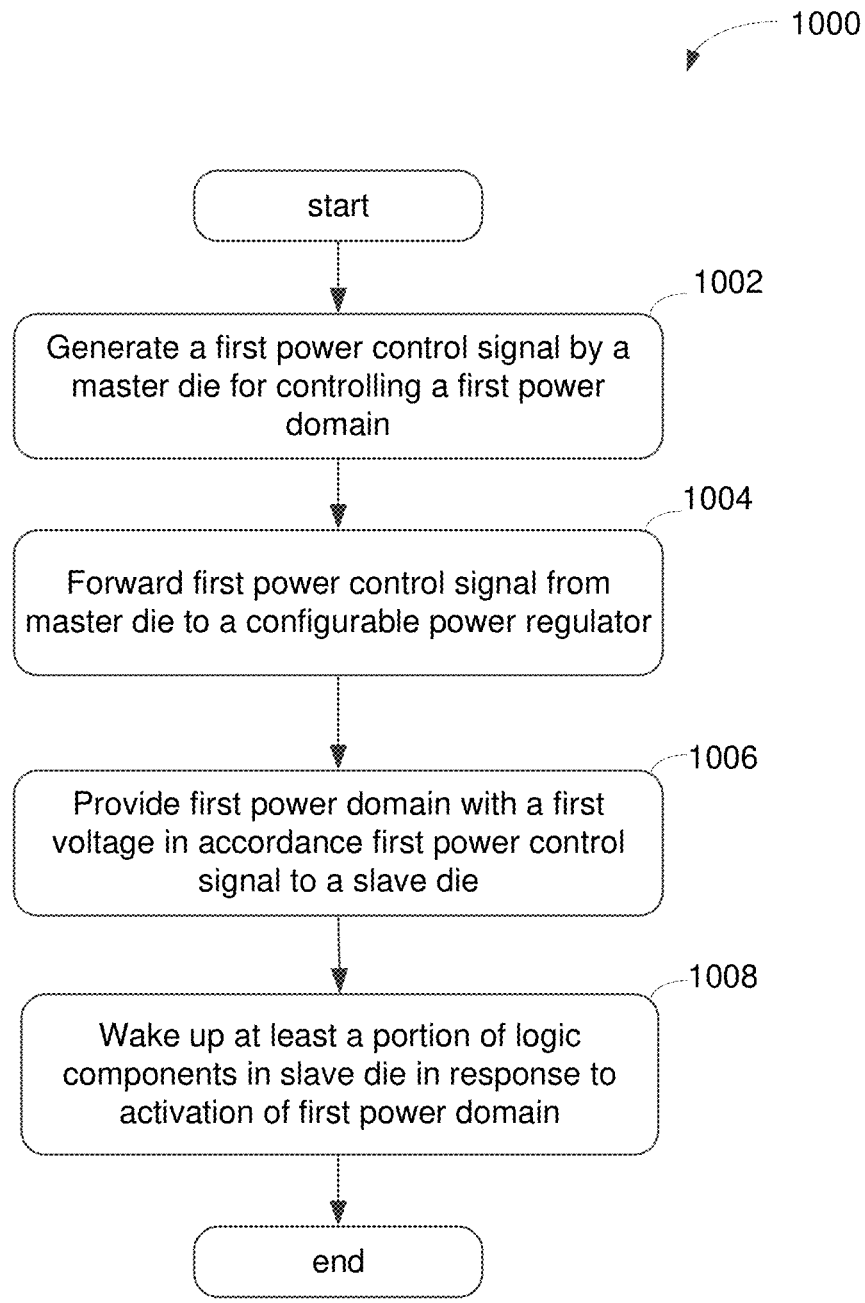
FIG. 10 is a flowchart illustrating a process of providing power domains to one or more regions using a regulator in accordance with one embodiment of the present invention.

FIG. 10 is a flowchart 1000 illustrating a process of providing multiple power domains to one or more regions using a regulator in accordance with one embodiment of the present invention. At block 1002, a process of a semiconductor device partitioned into multiple power domains facilitating dynamically power-down and power-up a portion of the device for power conservation generates a first power control signal by a master die for controlling a first power domain.

At block 1004, after the first power control signal is forwarded from the master die to a configurable power regulator to activate a first power domain, the first power domain, at block 1006, is provided with a first voltage in accordance the first power control signal to a slave die.

At block 1008, the process is capable of waking up at least a portion of logic components in the slave die in response to activation of the first power domain. In one embodiment, after generating a second power control signal by the master die for controlling a second power domain, the second power control signal is forwarded from the master die to the configurable power regulator to activate a second power domain. Upon providing the second power domain with a second voltage in accordance the second power control signal to a slave PLD die, at least a portion of logic components in the slave PLD die is woken up in response to activation of the second power domain.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A semiconductor device able to be selectively configured to perform one or more user defined logic functions, the device comprising:
a semiconductor die configured to perform logic functions in accordance with one or more inputs, the semiconductor die includes:
a first region operatable to perform a first set of logic functions based on a first power domain having a first voltage,
a second region coupled to the first region and configured to perform a second set of logic functions based on a second power domain having a second voltage, and
a selectable power regulator coupled to the semiconductor die and configured to provide the second voltage for facilitating the second power domain to the second region of the semiconductor die in response to at least one enabling input from the first region of the semiconductor die.

2. The device of claim 1, wherein the semiconductor die includes a field programmable gate array ("FPGA").

3. The device of claim 1, wherein the semiconductor die includes a microprocessor.

4. The device of claim 1, wherein the semiconductor die includes an application-specific integrated circuit ("ASIC") logic circuitry.

5. The device of claim 1, wherein the semiconductor die is an integrated circuit ("IC") for a system on a chip ("SOC").

6. The device of claim 1, wherein the selectable power regulator is configured to provide a plurality of voltages in response to a plurality of corresponding enabling inputs.

7. The device of claim 1, wherein the selectable power regulator is configured to provide the first voltage of 3.3 volts.

8. The device of claim 1, wherein the selectable power regulator is configured to provide the second voltage of 2.5 volts.

9. The device of claim 1, wherein the semiconductor device is a system in package ("SIP") containing multiple dies.

10. The device of claim 1, wherein the semiconductor device is fabricated on a single integrated circuit ("IC") chip.

11. A digital processing system configured to process information comprising:
a semiconductor device configured to perform logic functions in accordance with one or more inputs, the semiconductor device configured to have a first region and a second region, wherein the first region performs a first set of logic functions based on a first power domain having a first voltage and the second region performs a second set of logic functions based on a second power domain having a second voltage; and
a regulator remotely coupled to the semiconductor device and configured to provide the second voltage for facilitating the second power domain to the second region of the semiconductor die in response to enabling input to the regulator, wherein the enabling input is generated in response to the output from the first region of the semiconductor device.

12. The system of claim 11, wherein the semiconductor device is a field programmable gate array ("FPGA").

13. The system of claim 11, wherein the semiconductor device includes a field programmable gate array ("FPGA"), a microprocessor, and memory chips.

14. The system of claim 11, further comprising a bus connecting the regulator to the semiconductor device.

* * * * *